(12) United States Patent
Lee et al.

(10) Patent No.: US 8,201,129 B2
(45) Date of Patent: *Jun. 12, 2012

(54) PLD ARCHITECTURE FOR FLEXIBLE PLACEMENT OF IP FUNCTION BLOCKS

(75) Inventors: Andy L. Lee, San Jose, CA (US); Cameron McClintock, Mountain View, CA (US); Brian Johnson, Sunnyvale, CA (US); Richard Cliff, Los Altos, CA (US); Srinivas Reddy, Fremont, CA (US); Chris Lane, San Jose, CA (US); Paul Leventis, Toronto (CA); Vaughn Timothy Betz, Toronto (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 376 days.

This patent is subject to a terminal disclaimer.

(21) Appl. No.: 12/465,464

(22) Filed: May 13, 2009

(65) Prior Publication Data

US 2009/0224800 A1    Sep. 10, 2009

Related U.S. Application Data

(60) Division of application No. 11/202,616, filed on Aug. 12, 2005, now Pat. No. 7,584,447, which is a continuation of application No. 10/460,685, filed on Jun. 11, 2003, now Pat. No. 7,058,920, which is a division of application No. 10/057,442, filed on Jan. 25, 2002, now Pat. No. 6,605,962.

(60) Provisional application No. 60/289,311, filed on May 6, 2001.

(51) Int. Cl.
*G06F 17/50* (2006.01)
*G06F 7/38* (2006.01)

(52) U.S. Cl. ........ 716/126; 716/119; 716/128; 716/132; 716/138; 716/139; 326/39; 326/41; 326/46; 326/47

(58) Field of Classification Search ................. 716/126, 716/128, 132, 138; 326/39, 41, 46, 47
See application file for complete search history.

(56) References Cited

U.S. PATENT DOCUMENTS

| 4,758,985 A | 7/1988 | Carter |
| 4,855,669 A | 8/1989 | Mahoney |

(Continued)

FOREIGN PATENT DOCUMENTS

EP    0 079 127    5/1983

(Continued)

OTHER PUBLICATIONS

"50,000 Gate ASIC Prototyping PLD Using Four Flex 8000 Devices and a Programmable Interconnect," *7th Annual IEEE International ASIC Conf.*, 1994.

(Continued)

*Primary Examiner* — Helen Rossoshek
(74) *Attorney, Agent, or Firm* — Ropes & Gray LLP (57) ABSTRACT

In accordance with one aspect of the invention, a hole is formed within an LE array of a PLD by interrupting the LE array base signal routing architecture such that a hole is left for IP function block to be incorporated. An interface region is provided for interfacing the remaining LE array base signal routing architecture to the IP function block.

30 Claims, 7 Drawing Sheets

U.S. PATENT DOCUMENTS

| | | |
|---|---|---|
| 4,870,302 A | 9/1989 | Freeman |
| 4,871,930 A | 10/1989 | Wong et al. |
| 5,072,418 A | 12/1991 | Boutaud et al. |
| 5,121,006 A | 6/1992 | Pedersen |
| 5,142,625 A | 8/1992 | Nakai |
| 5,206,529 A | 4/1993 | Mine |
| RE34,363 E | 8/1993 | Freeman |
| 5,241,224 A | 8/1993 | Pedersen et al. |
| 5,243,238 A | 9/1993 | Kean |
| 5,260,611 A | 11/1993 | Cliff et al. |
| 5,274,570 A | 12/1993 | Izuma et al. |
| 5,311,114 A | 5/1994 | Sambamurthy et al. |
| 5,339,262 A | 8/1994 | Rostoker et al. |
| 5,347,181 A | 9/1994 | Ashby et al. |
| 5,361,373 A | 11/1994 | Gilson |
| 5,414,638 A | 5/1995 | Verrheyen et al. |
| 5,424,589 A | 6/1995 | Dobbelaere et al. |
| 5,455,525 A | 10/1995 | Ho et al. |
| 5,457,410 A | 10/1995 | Ting |
| 5,469,003 A | 11/1995 | Kean |
| 5,473,267 A | 12/1995 | Stansfield |
| 5,485,103 A | 1/1996 | Pedersen et al. |
| 5,500,943 A | 3/1996 | Ho et al. |
| 5,504,738 A | 4/1996 | Sambamurthy et al. |
| 5,537,057 A | 7/1996 | Leong et al. |
| 5,537,601 A | 7/1996 | Kimura et al. |
| 5,541,530 A | 7/1996 | Cliff et al. |
| 5,543,640 A | 8/1996 | Sutherland et al. |
| 5,550,782 A | 8/1996 | Cliff et al. |
| 5,552,722 A | 9/1996 | Kean |
| 5,557,217 A | 9/1996 | Pedersen |
| 5,574,930 A | 11/1996 | Halverson, Jr. et al. |
| 5,574,942 A | 11/1996 | Colwell et al. |
| 5,581,199 A | 12/1996 | Pierce et al. |
| 5,581,745 A | 12/1996 | Muraoka |
| 5,592,106 A | 1/1997 | Leong et al. |
| 5,600,845 A | 2/1997 | Gilson |
| 5,652,904 A | 7/1997 | Trimberger |
| 5,654,650 A | 8/1997 | Gissel |
| 5,671,355 A | 9/1997 | Collins |
| 5,682,107 A | 10/1997 | Tavana et al. |
| 5,689,195 A | 11/1997 | Cliff et al. |
| 5,701,091 A | 12/1997 | Kean |
| 5,705,938 A | 1/1998 | Kean |
| 5,705,939 A | 1/1998 | McClintock et al. |
| 5,732,250 A | 3/1998 | Bates et al. |
| 5,737,631 A | 4/1998 | Trimberger |
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,604 A | 6/1998 | Pierce et al. |
| 5,760,607 A | 6/1998 | Leeds et al. |
| 5,787,007 A | 7/1998 | Bauer |
| 5,801,546 A | 9/1998 | Pierce et al. |
| 5,801,547 A | 9/1998 | Kean et al. |
| 5,804,986 A | 9/1998 | Jones |
| 5,809,517 A | 9/1998 | Shimura |
| 5,825,202 A | 10/1998 | Tavana et al. |
| 5,831,448 A | 11/1998 | Kean et al. |
| 5,835,405 A | 11/1998 | Tsui et al. |
| 5,847,579 A | 12/1998 | Trimberger |
| 5,874,834 A | 2/1999 | New et al. |
| 5,880,598 A | 3/1999 | Duong |
| 5,889,411 A | 3/1999 | Chaudhry |
| 5,889,788 A | 3/1999 | Pressly et al. |
| 5,892,961 A | 4/1999 | Trimberger |
| 5,903,165 A | 5/1999 | Jones et al. |
| 5,907,248 A | 5/1999 | Bauer et al. |
| 5,909,126 A | 6/1999 | Cliff et al. |
| 5,914,616 A | 6/1999 | Young et al. |
| 5,914,902 A | 6/1999 | Lawrence et al. |
| 5,933,023 A | 8/1999 | Young |
| 5,942,913 A | 8/1999 | Young et al. |
| 5,970,254 A | 10/1999 | Cooke et al. |
| 5,977,793 A | 11/1999 | Reddy et al. |
| 6,011,407 A | 1/2000 | New |
| 6,020,755 A | 2/2000 | Andrews et al. |
| 6,026,481 A | 2/2000 | New et al. |
| 6,054,873 A | 4/2000 | Laramie |
| 6,057,707 A | 5/2000 | Schleicher et al. |
| 6,081,473 A | 6/2000 | Agarwal et al. |
| 6,084,429 A | 7/2000 | Trimberger |
| 6,096,091 A | 8/2000 | Hartmann |
| 6,107,824 A | 8/2000 | Reddy et al. |
| 6,137,308 A | 10/2000 | Nayak |
| 6,150,837 A | 11/2000 | Beal et al. |
| 6,154,051 A | 11/2000 | Nguyen et al. |
| 6,154,873 A | 11/2000 | Takahashi |
| 6,163,166 A | 12/2000 | Bielby et al. |
| 6,172,990 B1 | 1/2001 | Deb et al. |
| 6,178,541 B1 | 1/2001 | Joly et al. |
| 6,181,160 B1 | 1/2001 | Lee |
| 6,181,163 B1 | 1/2001 | Agrawal et al. |
| 6,184,706 B1 | 2/2001 | Heile |
| 6,184,712 B1 | 2/2001 | Wittig et al. |
| 6,204,689 B1 | 3/2001 | Percey et al. |
| 6,204,690 B1 | 3/2001 | Young et al. |
| 6,211,697 B1 | 4/2001 | Lien et al. |
| 6,218,859 B1 | 4/2001 | Pedersen |
| 6,242,945 B1 | 6/2001 | New |
| 6,242,947 B1 | 6/2001 | Trimberger |
| 6,255,849 B1 | 7/2001 | Mohan |
| 6,265,895 B1 | 7/2001 | Schleicher et al. |
| 6,271,679 B1 | 8/2001 | McClintock et al. |
| 6,272,451 B1 | 8/2001 | Mason et al. |
| 6,278,291 B1 | 8/2001 | McClintock et al. |
| 6,279,045 B1 | 8/2001 | Muthujumaraswathy et al. |
| 6,282,627 B1 | 8/2001 | Wong et al. |
| 6,289,412 B1 | 9/2001 | Yuan et al. |
| 6,292,018 B1 | 9/2001 | Kean |
| 6,300,793 B1 | 10/2001 | Ting et al. |
| 6,300,794 B1 | 10/2001 | Reddy et al. |
| 6,301,696 B1 | 10/2001 | Lien et al. |
| 6,329,839 B1 | 12/2001 | Pani et al. |
| 6,343,207 B1 | 1/2002 | Hessel et al. |
| 6,346,824 B1 | 2/2002 | New |
| 6,353,331 B1 | 3/2002 | Shimanek |
| 6,356,108 B2 | 3/2002 | Rangasayee |
| 6,356,987 B1 | 3/2002 | Aulas |
| 6,370,140 B1 | 4/2002 | Nayak |
| 6,389,558 B1 | 5/2002 | Herrmann et al. |
| 6,417,690 B1 | 7/2002 | Ting et al. |
| 6,427,156 B1 | 7/2002 | Chapman et al. |
| 6,429,681 B1 | 8/2002 | Hutton |
| 6,434,735 B1 | 8/2002 | Watkins |
| 6,448,808 B2 | 9/2002 | Young et al. |
| 6,460,172 B1 | 10/2002 | Insenser Farre et al. |
| 6,463,576 B1 | 10/2002 | Tomoda |
| 6,467,009 B1 | 10/2002 | Winegarden et al. |
| 6,476,636 B1 | 11/2002 | Lien et al. |
| 6,484,291 B1 | 11/2002 | Amiya et al. |
| 6,507,942 B1 | 1/2003 | Calderone et al. |
| 6,510,548 B1 | 1/2003 | Squires |
| 6,518,787 B1 | 2/2003 | Allegrucci et al. |
| 6,519,753 B1 | 2/2003 | Ang |
| 6,522,167 B1 | 2/2003 | Ansari et al. |
| 6,532,572 B1 | 3/2003 | Tetelbaum |
| 6,539,508 B1 | 3/2003 | Patrie et al. |
| 6,541,991 B1 | 4/2003 | Horncheek et al. |
| 6,570,404 B1 | 5/2003 | Norman et al. |
| 6,573,138 B1 | 6/2003 | Pass et al. |
| 6,573,749 B2 | 6/2003 | New et al. |
| 6,577,160 B2 | 6/2003 | Reddy et al. |
| 6,587,995 B1 | 7/2003 | Duboc et al. |
| 6,588,006 B1 | 7/2003 | Watkins |
| 6,593,772 B2 | 7/2003 | Ngai et al. |
| 6,601,227 B1 | 7/2003 | Trimberger |
| 6,604,228 B1 | 8/2003 | Patel et al. |
| 6,604,230 B1 | 8/2003 | Khalid et al. |
| 6,608,500 B1 | 8/2003 | Lacey et al. |
| 6,611,951 B1 | 8/2003 | Tetelbaum et al. |
| 6,634,008 B1 | 10/2003 | Dole |
| 6,662,285 B1 | 12/2003 | Douglass et al. |
| 6,744,278 B1 | 6/2004 | Liu et al. |
| 6,771,094 B1 | 8/2004 | Langhammer et al. |

| | | | |
|---|---|---|---|
| 6,864,710 | B1 * | 3/2005 | Lacey et al. ............... 326/39 |
| 6,904,527 | B1 * | 6/2005 | Parlour et al. ............. 713/189 |
| 7,236,008 | B1 | 6/2007 | Cliff et al. |
| 2001/0033188 | A1 | 10/2001 | Aung et al. |
| 2001/0049813 | A1 | 12/2001 | Chun et al. |
| 2002/0008541 | A1 | 1/2002 | Young et al. |
| 2002/0011871 | A1 | 1/2002 | Pani et al. |
| 2002/0070756 | A1 | 6/2002 | Ting et al. |
| 2002/0089348 | A1 | 7/2002 | Langhammer |
| 2002/0101258 | A1 | 8/2002 | Ting |
| 2002/0130681 | A1 | 9/2002 | Cliff et al. |
| 2002/0163358 | A1 | 11/2002 | Johnson et al. |
| 2002/0190751 | A1 | 12/2002 | Lee et al. |
| 2003/0062922 | A1 | 4/2003 | Donblass et al. |
| 2003/0188287 | A1 | 10/2003 | Park |
| 2003/0201794 | A1 | 10/2003 | Reddy et al. |
| 2004/0017222 | A1 | 1/2004 | Betz et al. |
| 2004/0032282 | A1 | 2/2004 | Lee et al. |
| 2004/0088672 | A1 | 5/2004 | Ting |
| 2004/0150422 | A1 | 8/2004 | Wong |
| 2004/0196066 | A1 | 10/2004 | Ting |

FOREIGN PATENT DOCUMENTS

| | | |
|---|---|---|
| EP | 0 315 275 | 5/1989 |
| EP | 0 415 542 | 3/1991 |
| EP | 0 486 248 | 5/1992 |
| EP | 0 806 836 | 11/1997 |
| EP | 0 905 906 | 3/1999 |
| EP | 0 919 916 | 6/1999 |
| EP | 0 734 573 | 4/2002 |
| EP | 1 235 351 | 8/2002 |
| GB | 2 300 951 | 11/1996 |
| JP | 58-087644 | 5/1983 |
| JP | 61-097849 | 5/1986 |
| JP | 2-205342 | 8/1990 |
| JP | 5-040804 | 2/1993 |
| JP | 07-142583 | 6/1995 |
| JP | 10-074840 | 3/1998 |
| JP | 10-092943 | 4/1998 |
| JP | 2000-150894 | 5/2000 |
| JP | 2000-315731 | 11/2000 |
| JP | 2001-005858 | 1/2001 |
| JP | 2003-023083 | 1/2003 |
| WO | WO93/25968 | 12/1993 |
| WO | WO94/28475 | 12/1994 |
| WO | WO99/56394 | 11/1999 |
| WO | WO00/44095 | 7/2000 |

OTHER PUBLICATIONS

"A Study on the Architecture and Logic Block Design of FPGA," Inspec. Abstract No. B9705-1265B-101.

"Computer Aided Routing for Complex Programmable Logic Device Manufacturing Test Development," *Proceedings from IEEE Southeast Con*, 2000.

"Dual Granularity and Globally Interconnected Architecture for a Programmable Logic Device," *Proceedings of IEEE*, 1993.

"FPGA's Strive for Synthesis Compatibility," *Computer Design*, vol. 34, Oct. 1995.

"Options Dot the Programmable-Logic Landscape," *EDN* vol. 40, Jul. 6, 1995.

"Programmable Logic Devices Combined with Multiple Fast Clock Data Recovery Blocks," *Elektronik Industrie*, vol. 32, No. 3, Mar. 2001.

"Reconfigurable Integrated Circuit for High Performance Computer Arithmetic," E.I. No. EIP9805421151.

Albaharna, O.T., "Area & Time Limitations of FPGA-Based Virtual Hardware," IEEE, pp. 184-189, Apr. 1994.

Altera Corporation, Excalibur "Description of the Floor Plan," pp. 1-1 through 1-10, Oct. 2001.

Altera Corporation, *Max 7000: Programmable Logic Device Family Data Book*, A-DB-0696-01, version 4, pp. 193-261, Jun. 1996.

Andrew, W.B., et al., "A Field Programmable System Chip Which Combines FPGA & ASIC Circuitry," IEEE, pp. 183-186, May 1999.

Betz, V., et al., eds., "Global Routing Architecture," *Architecture and CAD for Deep-Submicron FPGAs* (Kluwer Academic, Boston), Chapter 5, pp. 105-126, 1999.

Betz, V., et al., eds., "Background and Previous Work," *Architecture and CAD for Deep-Submicron FPGAs* (Kluwer Academic, Boston), Chapter 2, pp. 12-18, 1999.

Betz, V., et al., eds., "Detailed Routing Architecture," *Architecture and CAD for Deep-Submicron FPGAs* (Kluwer Academic, Boston), Chapter 7, pp. 151-190, 1999.

Betz, V., et al., eds., "Routing Tools and Routing Architecture Generation," *Architecture and CAD for Deep-Submicron FPGAs* (Kluwer Academic, Boston), Chapter 4, pp. 63-95, 1999.

Carter, W.S., "The Future of Programmable Logic and Its Impact on Digital System Design," IEEE, pp. 10-16, Apr. 1994.

Davidson, J., "FPGA Implementation of Reconfigurable Microprocessor," IEEE, pp. 3.2.1-3.2.4, Mar. 1993.

Dehon, A., "DPGA-Coupled Microprocessors: Commodity ICs for the Early 21st Century," IEEE, pp. 31-39, Feb. 1994.

Goetting, E., "Virtex-II IP-Immersion Technology Enables Next-Generation Platform FPGAs," *Xcell Journal*, Issue 40, pp. 36-37, Jul. 1, 2001.

Gopisetty et al., "Methodology for process portable hard IP block creation using cell based array architecture," *Proceedings Eleventh Annual IEEE International ASIC Conference*, pp. 271-275, Sep. 13-16, 1998.

IBM Corporation, "Mixture of Field and Factory Programmed Logic Cells in a Single Device," *IBM Technical Disclosure Bulletin*, vol. 38, No. 4, p. 499, Apr. 1, 1995.

IBM Corporation, "PowerPC 405 Embedded Processor Core User Manual," 5th Ed., pp. 1-1 to X-16, 1996.

IBM Corporation, "Processor Local Bus" Architecture Specifications, 32-Bit Implementation, 1st Ed., V2.9, pp. 1-76, May 2001.

Iseli, C., et al., "AC++ Compiler for FPGA Custom Execution Units Synthesis," pp. 173-179, IEEE, 1995.

Iseli, C., et al., "Beyond Superscaler Using FPGA's," IEEE, pp. 486-490, Apr. 1993.

Iseli, C., et al., "Spyder: A Reconfigurable VLIW Processor Using FPGA's," IEEE, pp. 17-24, Jul. 1993.

Kiaei, S., et al., "VLSI Design of Dynamically Reconfigurable Array Processor-DRAP," IEEE, pp. 2484-2488, V3.6, Feb. 1989.

Li, Y., et al., "AIZUP—A Pipelined Processor Design & Implementation on Xilinx FPGA Chip," IEEE, pp. 98-106, Sep. 1996.

Maki, G., et al., "A Reconfigurable Data Path Processor," IEEE, pp. 18-4.1 to 18-4.4, Aug. 1991.

Smith et al., "Intel's FLEXlogic FPGA architecture," *Compcon Spring '93, Digest of Papers*, pp. 378-384, Feb. 22-26, 1993.

Snyder, C.D., et al., "Xilinx's A-to-Z System Platform"; *Cahners Microprocessor; The Insider's Guide to Microprocessor Hardware; Microdesign Resources*; pp. 1-5, Feb. 2001.

Srini, V.P., "Field Programmable Gate Array (FPGA) Implementation of Digital Systems: An Alternative to ASIC," IEEE, pp. 309-314, May 1991.

Telikepalli, A., "Virtex-II Pro FPGAs: The Platform for Programmable Systems Has Arrived," *Xcell Journal*, Issue 43, pp. 10-13, Jul. 12, 2002.

Wirthlin, M.I., et al., "The Nano Processor: A Low Resource Reconfigurable Processor," IEEE, pp. 23-30, Feb. 1994.

Wittig, R.D., et al., "Onechip: An FPGA Processor with Reconfigurable Logic," pp. 126-135, IEEE, Apr. 1996.

Xilinx, Inc., "Programmable Logic: News and Views, a monthly report on developments in the PLD/FPGA industry" Electronic Trend Publications, Inc., IX(11): 14-15 (Includes Table of Contents), Nov. 2000.

Xilinx, Inc., "Putting It All the Together. The Vitrex-II Series Platform FPGA: World fastest logic and routing" brochure, p. 83, Oct. 2000.

Xilinx, Inc., "The Programmable Logic Data Book,", Ch 3, pp. 3-7 to 3-17; 3-76 to 3-87, 2000.

Xilinx, Inc., *The Programmable Logic Data Book*, 1994, Revised 1995.

Xilinx, Inc., *The Programmable Logic Data Book*, Ch. 3 pp. 3-1 to 3-117, 2000.

Xilinx, Inc., *The Programmable Logic Data Book*, Ch. 3, pp. 3-1 to 3-50, Jan. 1999.

Xilinx, Inc., *The Programmable Logic Data Book*, pp. 2-107 to 2-108, 1994, Revised 1995.

Xilinx, Inc., *The Programmable Logic Data Book*, pp. 2-109 to 2-117, 1994, Revised 1995.

Xilinx, Inc., *The Programmable Logic Data Book*, pp. 2-9 to 2-18; 2-187 to 2-199, 1994, Revised 1995.

Xilinx, Inc., *Virtex II Platform FPGA Handbook*, v1.1, pp. 33-75, Dec. 2000.

Yalcin et al., "Functional timing analysis for IP characterization," *Proceedings; 36th Design Automation Conference*, 1999, pp. 731-736, Jun. 21-25, 1999.

* cited by examiner

|  | Horizontal MegaRAM Interface | | Vertical MegaRAM Interface | |
|---|---|---|---|---|
|  | Ways in per line | Connections per MRAM_LIM | Ways in per line | Connections per MRAM_LIM |
| H4 | 3 | 8 | 0 | 0 |
| H8 | 3 or 4 | 2 or 3 | 0 | 0 |
| H24 | 0 | 0 | 0 | 0 |
| V4 | 1 or 2 | 4 | 4 or 5 | 12 |
| V8 | 1 or 2 | 1 or 2 | 3 or 4 | 4 |
| V16 | 0 | 0 | 0 | 0 |
| Sneak path from adjacent LAB | 1 | 0 or 1 | 0 | 0 |
| Total MRAM LIM fanin |  | 16 |  | 16 |
| Total number MRAM LIM muxes |  | 30 |  | 30 |

Fig.8.

|  | Mega-RAM Horizontal Interface | Mega-RAM Vertical Interface |
|---|---|---|
| H4 DIM | 9 or 10 | N/A |
| H8 DIM | 1, 2 or 3 | N/A |
| H24 DIM | 0 | N/A |
| V4 DIM | 5 | 5 |
| V8 DIM | 2 or 3 | 1 |
| V16 DIM | 0 | N/A |
| Total ways out per MegaRAM Out | 17 to 21 | 6 |

Fig.9.

|  | Mega-RAM Horizontal Interface | Mega-RAM Vertical Interface |
|---|---|---|
| Lablines | 30 | 30 |
| MRIMs | 24 | 24 |
| H4 Drivers | 20 | 0 |
| H8 Drivers | 3 | 0 |
| H24 Drivers | 0 or 1 | 0 |
| V4 Drivers | 10 + 10 redundant | 20 |
| V8 Drivers | 2 + 2 redundant | 4 |
| V16 Drivers | 0 or 1 + 0 or 1 redundant | 0 |

PLD ARCHITECTURE FOR FLEXIBLE PLACEMENT OF IP FUNCTION BLOCKS

RELATED APPLICATIONS

This is a division of commonly-assigned U.S. patent application Ser. No. 11/202,616, filed Aug. 12, 2005, now U.S. Pat. No. 7,584,447, which is a continuation of application Ser. No. 10/460,685, filed Jun. 11, 2003, now U.S. Pat. No. 7,058,920, which was a division of application Ser. No. 10/057,442, filed Jan. 25, 2002, now U.S. Pat. No. 6,605,962, which claimed the benefit of U.S. Provisional Patent Application No. 60/289,311, filed May 6, 2001. Each of these prior applications is hereby incorporated by reference herein in its respective entirety.

TECHNICAL FIELD

The present invention is in the field of programmable logic devices (PLD's) and, more particularly, relates to a flexible architecture by which logic elements (LE's) of a PLD having an array of logic elements are replaced with intellectual property (IP) function blocks.

BACKGROUND

Conventional programmable logic devices (PLD's) comprise one or more arrays of logic elements (LE's), and the base signal routing architecture between LE's is designed such that LE-to-LE routing (typically performed by software programs that convert hardware design language program instructions into such routing) is optimized. Examples of PLD's having more than one array include PLD's in the APEX family of devices, by Altera Corporation of San Jose, Calif. It is sometimes desired to add one or more IP function blocks among an LE array. For the purposes of this disclosure, an LE is considered to be a basic—or most common—logic element that functions, for example, with respect to look-up table or macrocell logic. The LE's of an array are nominally connected by a base signal routing architecture. An IP function block is a functional block that is not constrained by the function of the most common logic element. For example, by way of illustration and not by limitation, an IP function block may be a high-speed serial interface (HSSI), a digital signal processor or other microprocessor, ALU, memory, or a multiplier.

Conventionally, when an IP function block is added to an LE array, the IP function block is placed at an edge of the LE array and spanning the entire edge of the LE array. This minimizes the disruption in the base routing. Furthermore, by placing the IP function block at an edge of the array, the performance degradation that would otherwise be caused by routing over the IP function block is minimized. A disadvantage of placing the IP function block at an edge of the LE array, however, is that the input/output (I/O) cells (for communication off the LE array) are conventionally located at the edge of the LE array. The IP function block may not even require access to the I/O cells at that edge but, nonetheless, impedes access by other elements (LE's, or even other IP function block) to the I/O cells at the edge where the IP function block is placed. In some cases, such as is described in U.S. Pat. No. 5,550,782, a block such as an embedded array block (EAB) completely replaces a logic array block (LAB) of LE's. In this case, the routing connects to the EAB in much the same way that the routing interfaces with the conventional logic block and, thus, there is no corresponding performance degradation.

Clearly, placement of an IP function block within an LE array of a PLD has commonly been an afterthought such that, typically, an IP function block was merely placed where it could best fit to minimize the disruption to the base signal routing architecture. What is desired is a PLD architecture by which the placement of an IP function block is not dictated by the goal of minimizing the disruption to the base signal routing architecture.

SUMMARY

In accordance with one aspect of the invention, a "hole" is formed within an LE array of a PLD by interrupting the base signal routing architecture such that a hole is left for the IP function block to be incorporated. An interface region is provided for interfacing the remaining base signal routing to the IP function block. This provides for flexible placement of IP function block within the regular LE-routing structure of the PLD.

DETAILED DESCRIPTION

Figure 1:
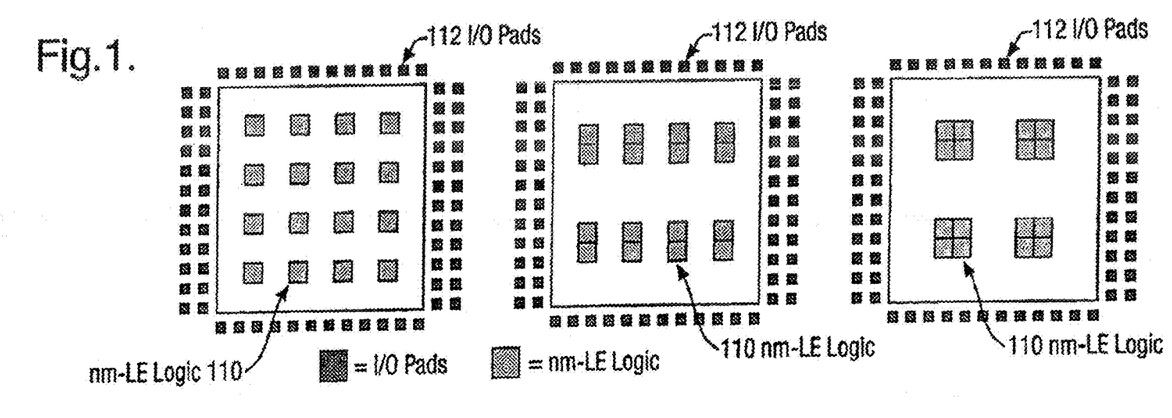
FIG. 1 illustrates possible placements of "big" IP function blocks within a PLD and not adjacent to an edge of the LE array, for a "big" IP function block such as a memory for which direct I/O access is not a requirement.
Figure 2:
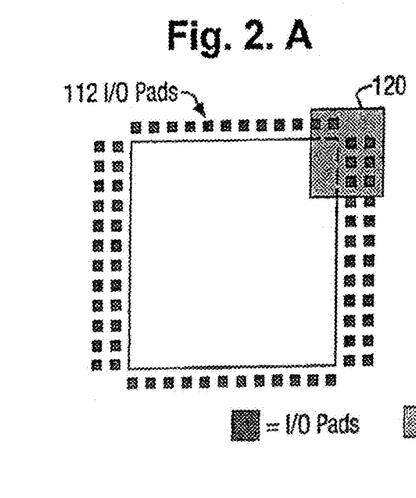
FIGS. 2A, 2B and 2C illustrate possible placements of big IP function blocks within a PLD and adjacent to an edge of the LE array such that direct I/O access is provided.

FIGS. 1 and 2 illustrate possible floorplans for a PLD architecture in accordance with an aspect of the invention. The illustrations in FIG. 1 are examples only, and the invention is not limited to the examples shown in FIG. 1. In accordance with the invention, a method of creating the FIG. 1 floorplans (and other floorplans within the scope of the invention) is now described.

The base signal routing architecture is defined and optimized for LE's. For example, an array of LE's is created for a particular target die size. For variants of the created LE array, as discussed in the Background, it is desired to place the IP function block within the LE array. In some embodiments, the IP function block is added as IP function blocks at some desired uniform density, although the density of IP function blocks need not be uniform. For IP function blocks added to the LE array, LE's are replaced. Thus, there is a tradeoff between LE's and the amount of IP added to the die. The array of LE's for which a particular base signal routing architecture is optimized may occupy substantially an entire target die. Alternately, a base signal routing architecture may be optimized for an array of LE's that coexists on a die with other circuitry, including other LE's.

FIGS. 1A, 1B and 1C illustrate IP function block 110 incorporated within the interior of an LE array, for an IP function block that does not require direct I/O pad 112 access. FIGS. 2A and 2B illustrate an IP function block 120 incorporated at the edge of the LE array but not spanning the entire edge of the LE array, such that I/O pad 112 access is provided to the IP function block 120. Furthermore, while not shown in FIGS. 2A and 2B, the IP function block can even displace I/O pads 112, if desired.

Figure 3:
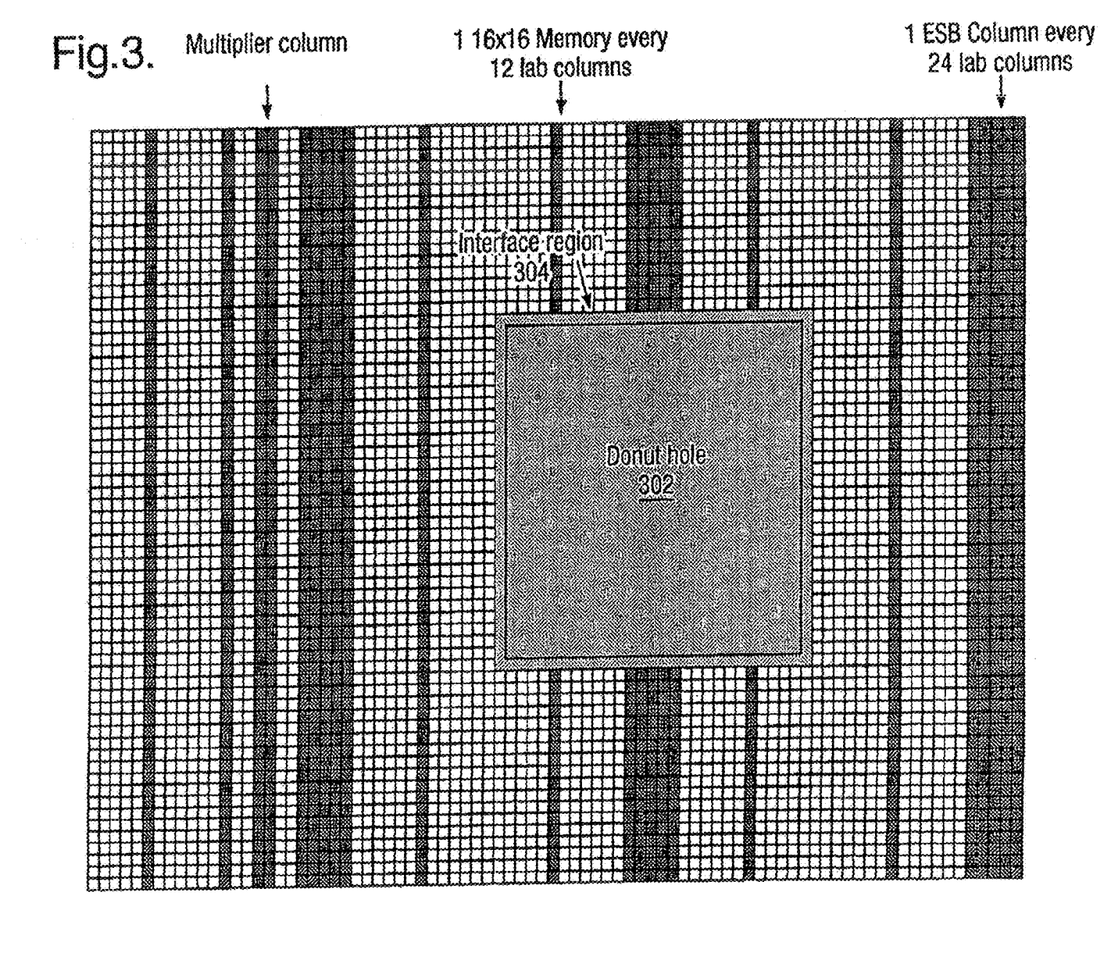
FIG. 3 illustrates a "donut hole" within the context of a PLD, for placement of a "big" IP function block within a PLD and not adjacent to an edge of the LE array.

FIG. 3 illustrates how an IP function block is incorporated as a "donut hole" 302 as applied to the FIG. 1 examples. That is, within the region where the IP function block is incorporated, the base signal routing architecture is interrupted, and a hole 302 is left (at least in one layer of the metal) for the IP function block to be incorporated. In addition, an interface region 304 is provided completely surrounding the hole 302 for interfacing the remaining base signal array routing to the IP function block. A very specific example of one such interface block is described later with reference to FIGS. 5 and 6. It should be noted that some of the lines of the base signal routing architecture may be routed around the hole 302 by being raised from the interface region 304 at one side of the hole 302 to a different layer of the metal not occupied by the hole 302 and lowered back into the interface region 304 at another side of the hole 302, typically the opposite side of the hole 302. To generalize, signal routing lines for driving shorter distances are terminated, and routing lines for driving longer distances are raised to a different layer of metal, buffered across the hole, and lowered into the interface region at the opposite side of the donut hole. What is "shorter" and "longer" is variable for any particular embodiment and is discussed later with respect to the size of the interruption—"small" or "large." Typically, those routing lines buffered across a hole do so without being connected to the IP function block in the hole region.

An interface region is provided even when the IP function block is not to be bordered on all four sides by the base signal routing architecture as illustrated in the FIG. 3 embodiment but, rather, is to be bordered on two sides (an example of which is shown in FIG. 2A), three sides (an example of which is shown in FIG. 2B), or even one side (an example of which is shown in FIG. 2C). The interface region is typically provided on each side of the hole that borders the base signal routing architecture.

Figure 4:
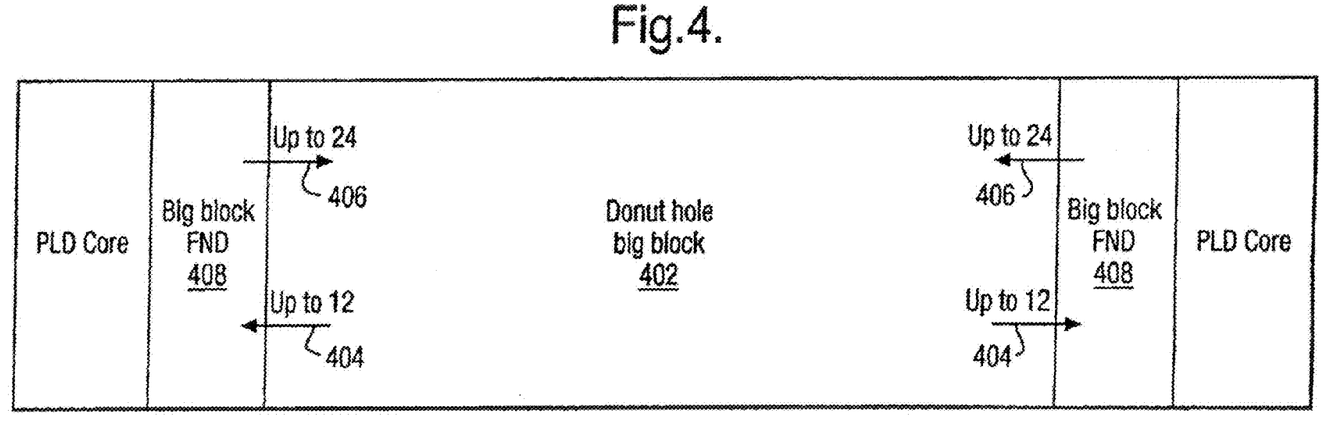
FIG. 4 illustrates, in greater detail, a "big block" interface region as used in FIGS. 1, 2 and 3.

FIG. 4 illustrates an embodiment of the interface region 304. That is, in accordance with the FIG. 4, it is shown that, for some level of granularity, the interface region 408 includes up to 24 signal lines into the hole 402 and up to 12 signal lines out of the hole 402. The interface region 408 is built modularly, at a particular level of granularity. In one embodiment, the particular level of granularity is one width or height of the logic array block (LAB) of the LE array.

A design consideration for the placement of a hole is the number of signal lines in and out of a hole that would result from a particular placement, primarily as a result of the extent to which the hole would border the base signal routing architecture. This can be seen with reference again to FIGS. 2A and 2B.

Figure 5:
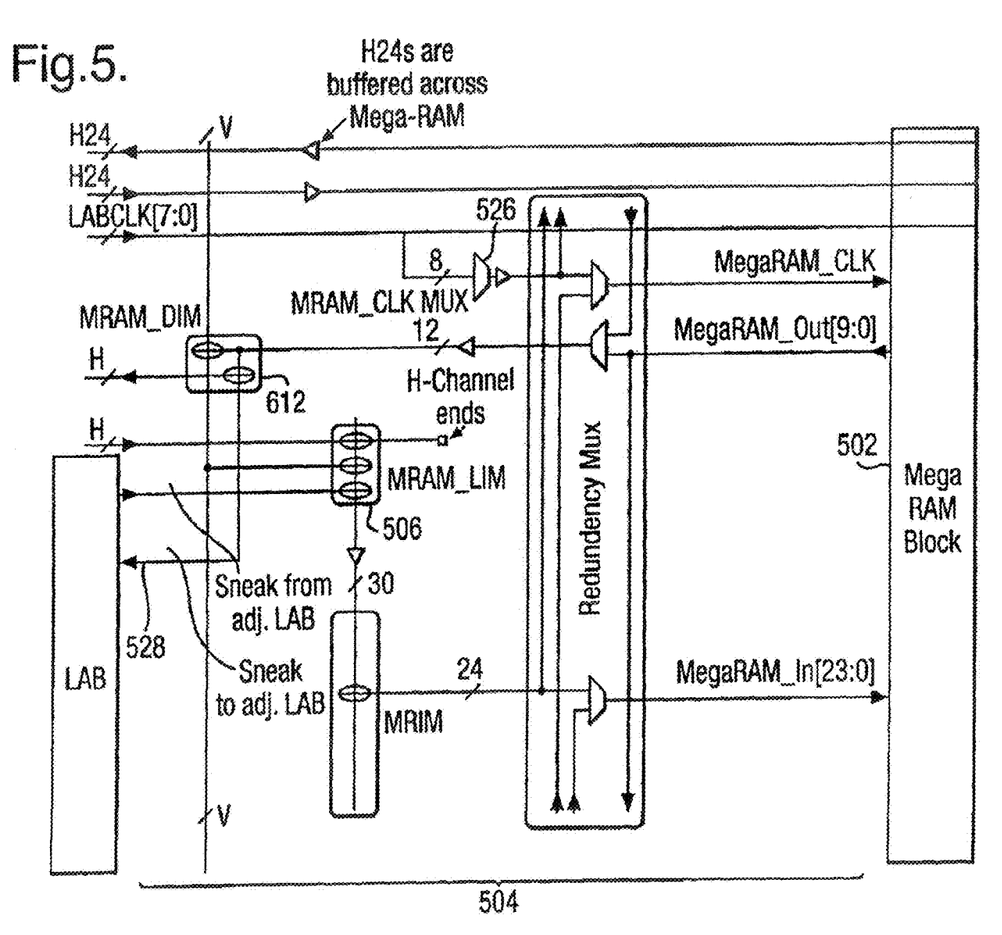
FIG. 5 illustrates the horizontal interface to a "big block" that is a large random access memory ("MRAM").
Figure 6:
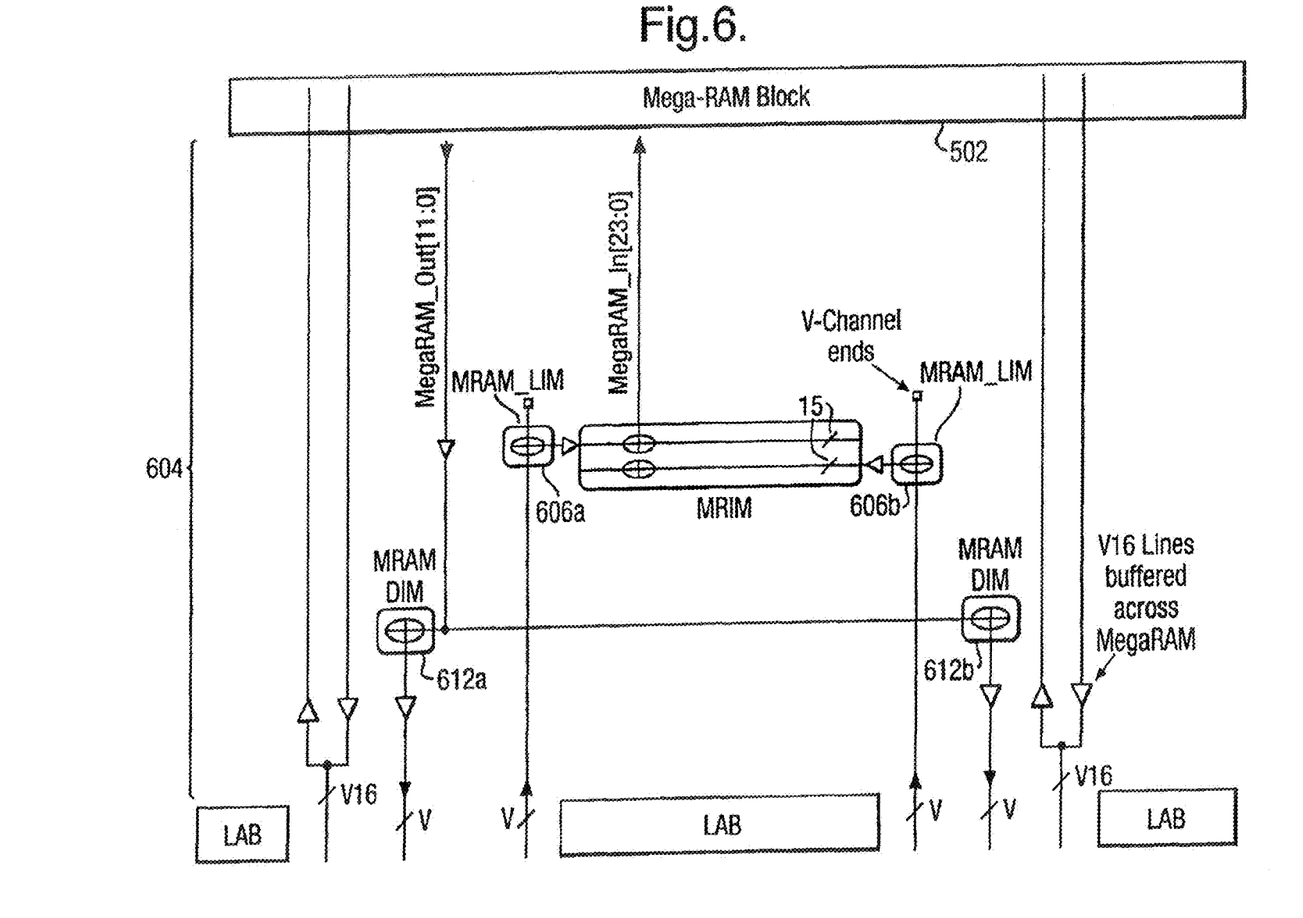
FIG. 6 illustrates the vertical interface to the MRAM.

FIGS. 5 and 6 illustrate a situation where the IP function block is a RAM block (designated in FIGS. 5 and 6 as a "Mega-RAM" 502). FIG. 5 illustrates the situation from the horizontal routing perspective, and FIG. 6 illustrates the situation from the vertical routing perspective. The Mega-RAM block 502 spans multiple columns and multiple rows of the LE array, and therefore interfaces with many lines ("channels") of routing. The general routing does not cross the Mega-RAM 502. Rather, the general routing "dead ends" at the Mega-RAM Interface (a specific instance of the FIG. 3 interface region) to form the donut hole for the Mega-RAM. The H24 (FIG. 5) and V16 (FIG. 6) routing lines are buffered across the Mega-RAM block. The Mega-RAM horizontal interface 504 (FIG. 5) allows the Mega-RAM to interface to logic to the left or to the right of the Mega-RAM. The Mega-RAM vertical interface 604 (FIG. 6) allows the Mega-RAM to interface to logic above and below the Mega-RAM. In the Mega-RAM vertical interface (FIG. 6), there are two groups of fifteen MRAM_LIM's (Not all are shown). Each of the two groups is fed by a different V-Channel. One Mega-RAM interface is provided on each of the left and right hand edges of the MegaRAM for every LAB row it spans, and one Mega-RAM interface is provided on each of the top and bottom edges of the Mega-Ram for every pair of LAB columns it spans.

Driving into the Mega-RAM 502 is now described. H and V routing lines in a typical embodiment connect into MRAM_LIM's 506, 606a and 606b (LAB input multiplexers). The MRAM_LIM 506, 606a and 606b is a two stage 4-way sharing multiplexer. Of the portion of the routing that terminates at the boundaries of the Mega-RAM 502, only the routing able to carry signals toward the Mega-RAM 502 feeds the MRAM_LIM's 506, 606a and 606b. Therefore, if the routing is unidirectional (i.e., each line can carry a signal in one direction), then routing able to carry signals away from the MRAM will not be coupled to the input interface. In another embodiment, bi-directional lines are used in addition to, or in place of, unidirectional lines.

Figure 7:
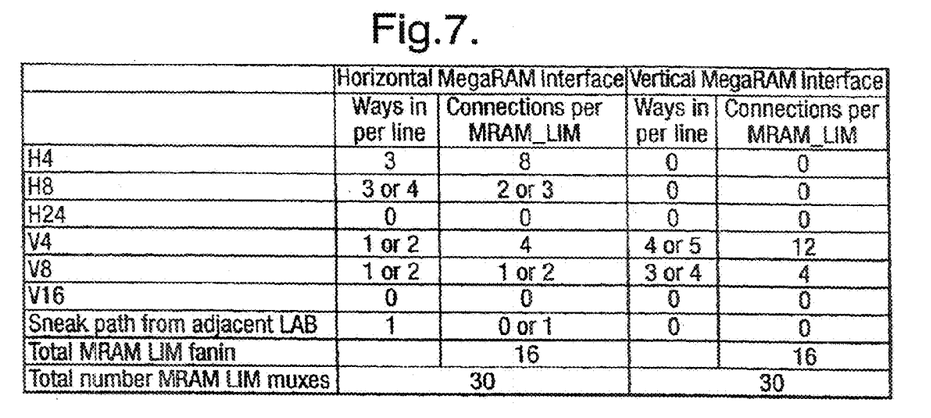
FIG. 7 is a table illustrating connectivity details of the MRAM_LIM

Connectivity details of the MRAM_LIM 506, 606a and 606b are listed in the table of FIG. 7. Briefly, FIG. 7 lists the number of "ways in per line" and the number of "connections per MRAM_LIM" for each of the Horizontal MegaRAM interface (FIG. 5) and the Vertical MegaRAM interface (FIG. 6). At the bottom of the FIG. 7 table, the listed totals include the total number of MRAM_LIM fan in signals, and the total number of MRAM_LIM multiplexers, for each of the Horizontal MegaRAM interface and the Vertical MegaRAM interface.

Clock inputs 524 are taken into the Mega-RAM block 502 from the global clock network at the side of the Mega-RAM block 502 through the Mega-RAM horizontal interface 504 in (FIG. 5). The MRAM_CLOCK MUX 526 chooses one of the eight LABCLK's that are feeding through the adjacent LABs. There is one clock input to the Mega-RAM 502 per row, although the Mega-RAM 502 typically would not use every clock input available to it.

The Mega-RAM input mux ("MRIM") is a fully populated 4-way mux-sharing mux that connects thirty LAB lines onto twenty-four I/O block inputs.

Driving out of the Mega-RAM 502 is now described. At the edge of the Mega-RAM, routing lines driving into the core do not have LAB's to drive them and are left as partial length lines. The Mega-RAM interface uses the full-length and partial length (i.e., length four and length eight lines, in this embodiment) to connect to the core via the MRAM_DIM. The Mega-RAM interface provides similar resources as are provided for a LAB to drive onto the core routing. For example, H4 lines extending four LAB's into the core are driven, and H4 lines extending three LAB's in or less are not driven. These partial length lines are driven to Vcc. In another embodiment, the partial length lines connect to the MRAM_LIM's as described below with reference to FIG. 10.

The Mega-RAM horizontal interface can also drive signals out onto the adjacent V-channel routing. Ten partial length sneak paths (H4, H8, V16, H24) (e.g., as collectively designated by line 528) are driven directly into adjacent LAB's by ten of the twelve MegaRAM_Out signals for a "quick" path to logic.

Each MRAM driver input multiplexer ("MRAM DIM") 612a, 612b supports the V-channel at the edge of the core and the half H-channel able to carry signals from the MRAM in the direction of the core. The Mega-RAM vertical interface 604 drives the full-length routing resources of two full V-channels. These drivers are dedicated to the MegaRAM_Out signals and do not support turns from other routing resources. The DIM's 612a and 612b associated with the V-line drivers in the Mega-RAM vertical interface 604 are used to choose between MegaRAM_Out signals. Each DIM 612a, 612b in the vertical interface is a 4:1 mux that can be implemented in one or more stages, and each input to the DIM is a MegaRAM_Out signal. The connection pattern from the MegaRAM_Out signals to the DIM 612a, 612b is typically spread equally between the two V-channels.

Figure 8:
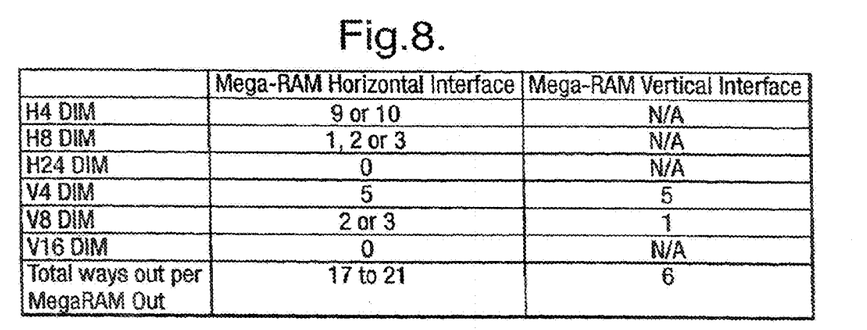
FIG. 8 is a table illustrating the MegaRAM_Out signal connections.
Figure 9:
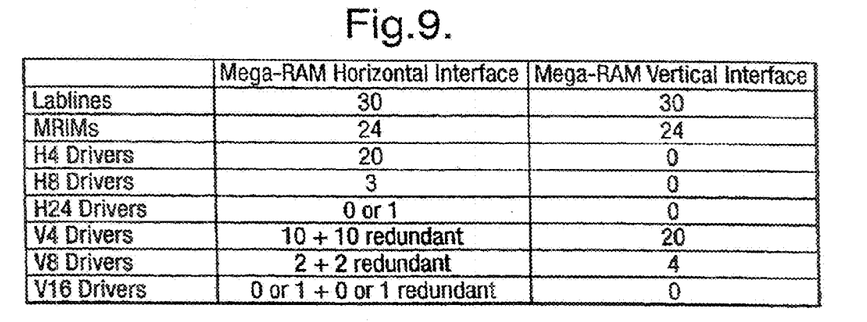
FIG. 9 is a table illustrating the Mega-RAM interface specifications.

The number of MegaRAM_Out signal connections per DIM for each of the Mega_RAM Horizontal Interface (FIG. 5) and the Mega_RAM Vertical Interface (FIG. 6) are set forth in FIG. 8. FIG. 9 is a summary of the Mega_RAM interface specifications for each of the Mega_RAM Horizontal Interface and the Mega_RAM Vertical Interface, and lists the total number of the various interface components described above.

It is noted that, typically, not all IP function blocks need be incorporated into an LE array using the hole concept. For example, the IP function block may be of two types—small and large. In general, the terms small and large as used here can be thought of as indicating size. One actual design consideration, however, in determining whether to consider particular IP function block as small or large is a consideration of how much disruption to the timing of signal routing is to be tolerated. For example, in accordance with one embodiment, a small block is an IP function block whose layout can be drawn at a width on the order of an LE width. In accordance with this embodiment, the width of small blocks may be wider than an LE so long as the timing of signal routing over the block does not get significantly larger than for routing over an LE. For example, in one 0.13 μm architecture, it has been deemed that the timing of the signal routing over a block of roughly 5 LE widths does not get significantly larger than for routing over an LE. Typically, additional inputs and/or outputs may be added that exceed the width of an LE, so long as the base signal routing architecture across the IP function block is maintained with the LE's surrounding the small block. Another consideration for determining whether an IP function block is large (implemented using the hole concept) or small is the size of the IP function block relative to the overhead associated with employing an interface region. In one embodiment, small blocks include MEAB's (medium sized embedded array blocks), SEAB's (small sized embedded array blocks) and a DSP block. By contrast, large blocks are IP function blocks that typically have dimensions much larger than that of an LE. Extending the base signal routing architecture across these blocks without modification would cause routing over these blocks to be significantly larger than routing over an LE, forming a boundary in the PLD timing model. Such large blocks may be inserted into the LE array as holes in the base signal routing architecture, as described above. In some sense, what occurs at the boundary between the base signal routing architecture and a hole is similar to the base signal routing architecture ending at the edge of an LE array.

Figure 10:
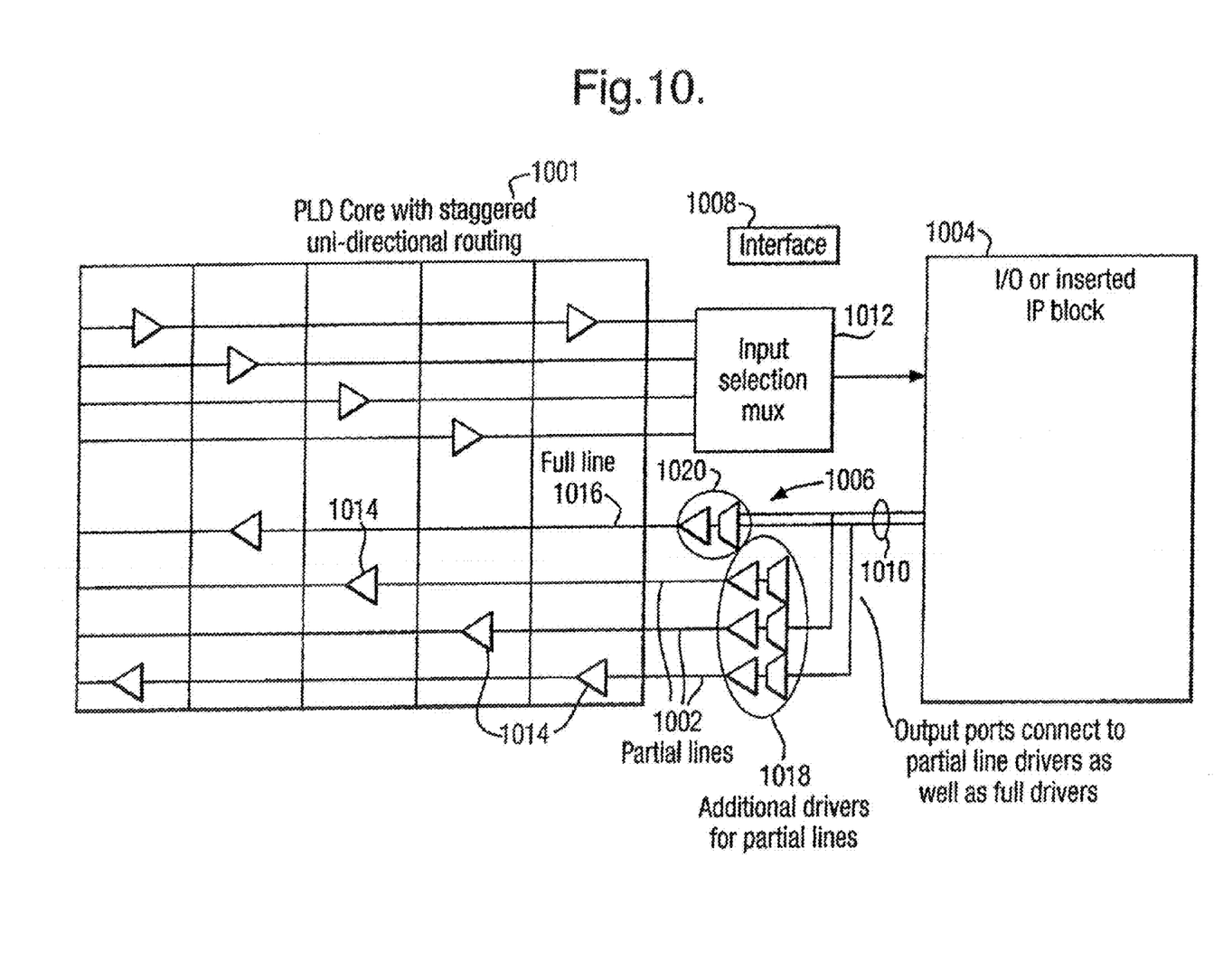
FIG. 10 illustrates an embodiment of a staggered routing architecture, in which the partial lines at the boundary of the staggered routing architecture are driven.

In some embodiments, shown with reference to FIG. 10, the LE routing lines are part of a staggered, uni-directional routing architecture. As a result of the staggering, as can be seen from FIG. 10, there are partial lines 1002 at boundaries formed by, for example, the I/O interface 1008 at the edge of the PLD 1001 or by an inserted IP function block (designated by reference numeral 1004). In accordance with some such staggered architecture embodiments, routing drivers 1006 are included in the interface region 1008 (whether the I/O interface region or the hole interface region) to drive both the full and partial lines. The output ports 1010 of the logic block 1004 connect to the drivers of both the "full" lines and the "partial" lines. Signal selection muxes may be used in front of the drivers to add routing flexibility. As described above, the routing may also be implemented with segmented bi-directional lines.

The partial lines 1002 driving out of the PLD core 1001 feed an input selection mux 1012 to drive into the logic block 1004. These partial lines 1002 impose a smaller load on the drivers 1014 than do full lines 1016, and having a small load makes the partial line 1002 a faster path into the PLD core 1001. If area is a concern, drivers 1018 for partial lines 1002 may be smaller than drivers 1020 for full lines 1016, and still not be at a speed disadvantage due to the smaller load.

Furthermore, by driving even the partial lines 1002, additional routing flexibility is provided for signals from the PLD core 1001 to the PLD boundaries. Allowing the partial lines 1002 headed out of the PLD 1001 to drive into an IP function block 1004 increases the routability from the PLD core 1001 to the logic block 1004. In addition, the additional drivers 1018 may be used to provide the core 1001 access to more signals, or the signals may be used to provide more paths into the PLD core 1001 for a given signal. Thus, quite simply, lines that would have otherwise been unused are utilized to provide needed access to the PLD core 1001.

While the present invention has been particularly described with respect to the illustrated embodiments, it will be appreciated that various alterations, modifications and adaptations may be based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the claims. For example, the techniques described herein may be applied to other types of fixed blocks or routing structures.

What is claimed is:
1. A programmable logic device, comprising:
   a plurality of logic elements arranged in a predetermined pattern;
   a base signal routing architecture including a plurality of signal routing lines to route signals among the logic elements;
   at least one IP function block inserted into the predetermined pattern in place of a two-dimensional portion of the logic elements, the insertion of the IP function block interrupting, at least in part, the base signal routing architecture; and
   an interface region existing between the logic elements and the IP function block, the interface region comprising interfacing circuitry operative to selectively apply signals to and from the IP function block.

2. The programmable logic device of claim 1, wherein the interfacing circuitry selectively applies a signal provided by the base signal routing architecture to the IP function block as a function block input signal.

3. The programmable logic device of claim 1, wherein the interfacing circuitry selectively applies a signal provided by a logic element immediately adjacent to the interface region to the IP function block as a function block input signal.

4. The programmable logic device of claim 1, wherein the interfacing circuitry selectively applies an IP function block output signal provided by the IP function block to the base signal routing architecture.

5. The programmable logic device of claim 1, wherein the interfacing circuitry selectively applies an IP function block output signal provided by the IP function block to a logic element immediately adjacent to the interface region.

6. The programmable logic device of claim 1, further comprising a plurality of memory blocks that are included within the predetermined pattern of logic elements, wherein the interface region exists between the memory blocks and the IP function block, the interface region comprising interfacing circuitry operative to route signals to and from the IP function block.

7. The programmable logic device of claim 6, wherein the interfacing circuitry selectively applies a signal provided by a memory block immediately adjacent to the interface region as a function block input signal.

8. The programmable logic device of claim 6, wherein the interfacing circuitry selectively applies an IP function block output signal provided by the IP function block to a memory block immediately adjacent to the interface region.

9. The programmable logic device of claim 1, wherein the interfacing circuitry comprises at least one multiplexer.

10. The programmable logic device of claim 1, wherein the interfacing circuitry comprises interfacing logic.

11. The programmable logic device of claim 1, further comprising a plurality of input/output pads, wherein the function block is incorporated into the predetermined pattern of logic elements such that the interfacing region has direct access to at least one of the input/output pads.

12. The programmable logic device of claim 1, further comprising a plurality of input/output pads, wherein the function block is incorporated into the predetermined pattern of logic elements such that it displaces at least one of the input/output pads.

13. The programmable logic device of claim 1, wherein the base signal routing architecture comprises short lines and long lines, wherein a first subset of the short lines connect to the IP function block and second subset of the short lines terminate at the IP function block while at least one long line is buffered over the IP function block.

14. The programmable logic device of claim 1, wherein the IP function block is selected from the group consisting of high-speed serial interface, a digital signal processor, a microprocessor, arithmetic logic unit, memory, random access memory, and a multiplier.

15. A semiconductor integrated circuit, comprising:
a plurality of components arranged in a multi-dimensional array with at least one IP function block inserted into the array; and
a base signal routing architecture connected to the components and at least partially interrupted by the IP function block, such that a first portion of the base routing architecture is coupled to the IP function block and a second portion of the base signal routing architecture is selectively applied over the IP function block.

16. The semiconductor integrated circuit of claim 15, wherein at least a subset of the first portion is terminated at the IP function block.

17. The programmable logic device of claim 16, wherein the IP function block is selected from the group consisting of high-speed serial interface, a digital signal processor, a microprocessor, arithmetic logic unit, memory, random access memory, and a multiplier.

18. The semiconductor integrated circuit of claim 15, wherein:
the semiconductor integrated circuit further comprises an interface portion, wherein
the first portion of the base signal routing architecture is coupled to the IP function block via the interface portion.

19. The semiconductor integrated circuit of claim 15, wherein the base signal routing architecture includes long routing lines and short routing lines, wherein at least some of the long routing lines are routed across the IP function block and at least some of the short routing lines terminate or connect to the IP function block.

20. The semiconductor integrated circuit of claim 15, wherein the components comprise logic elements.

21. The semiconductor integrated circuit of claim 15, wherein the components comprise memory blocks.

22. The semiconductor integrated circuit of claim 15, wherein the multi-directional array is a three-dimensional array comprising rows and columns of the components that exist in layers in a plurality of layers.

23. The semiconductor integrated circuit of claim 22, wherein the first portion of the base signal routing architecture and the IP function block reside in a subplurality of the layers and wherein the second portion of the base signal routing architecture resides in layers other than the subplurality of layers.

24. The semiconductor integrated circuit of claim 15 wherein the IP function block is a first IP function block, the semiconductor integrated circuit further comprising:
a second IP function block inserted into the multi-dimensional array of components, wherein the base signal routing architecture is at least partially interrupted by the second IP function block, such that a third portion of the base signal routing architecture is terminated at the second IP function block and a fourth portion of the base signal routing architecture is routed across the second IP function block.

25. The semiconductor integrated circuit of claim 15, wherein the timing of the second portion of the base signal routing architecture is delayed by less than a predetermined threshold as compared to the timing of a portion of the base signal routing architecture that is not interrupted by the IP function block and that spans approximately the same distance as the second portion.

26. A semiconductor integrated circuit, comprising:
a plurality of components arranged in a multi-dimensional array with at least one IP function block inserted into the array; and
a base signal routing architecture connected to the components and at least partially interrupted by the IP function block, such that a first portion of the base routing architecture is terminated at the IP function block and a second portion of the base signal routing architecture is selectively applied across the IP function block.

27. The semiconductor integrated circuit of claim 26, wherein:
the semiconductor integrated circuit further comprises an interface portion, wherein
signals existing on the first portion of the base signal routing architecture are selectively routed to the IP function block via the interface portion.

28. The semiconductor integrated circuit of claim 26, wherein the components comprise logic elements.

29. The semiconductor integrated circuit of claim 26, wherein the components comprise memory elements.

30. The programmable logic device of claim 26, wherein the IP function block is selected from the group consisting of high-speed serial interface, a digital signal processor, a microprocessor, arithmetic logic unit, memory, random access memory, and a multiplier.

* * * * *